(12) United States Patent
Huang et al.

(10) Patent No.: US 10,069,406 B2
(45) Date of Patent: Sep. 4, 2018

(54) EMI FILTER AND SWITCHING POWER SUPPLY WITH THE SAME

(71) Applicant: Silergy Semiconductor Technology (Hangzhou) LTD, Hangzhou, ZheJiang Province (CN)

(72) Inventors: Qiukai Huang, Hangzhou (CN); Jian Deng, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/368,770

(22) Filed: Dec. 5, 2016

(65) Prior Publication Data

US 2017/0179815 A1    Jun. 22, 2017

(30) Foreign Application Priority Data

Dec. 22, 2015    (CN) .......................... 2015 1 0975860

(51) Int. Cl.
*H02M 1/44* (2007.01)
*H02M 7/06* (2006.01)
*H03H 11/02* (2006.01)

(52) U.S. Cl.
CPC ............... *H02M 1/44* (2013.01); *H02M 7/06* (2013.01); *H03H 11/02* (2013.01)

(58) Field of Classification Search
CPC ........ H02M 1/12; H02M 1/15; H02M 1/4208; H02M 1/44; H02M 7/129; H02M 7/151; H02M 7/1557; H02M 7/1628; H02M 3/33507; H02M 3/33523; Y02B 70/126
USPC .............................. 363/21.01, 46–48, 81–89
See application file for complete search history.

(56) References Cited

U.S. PATENT DOCUMENTS

| 4,940,929 | A | * | 7/1990 | Williams | ............ | H02M 1/4225 |
| | | | | | | 323/222 |
| 5,894,214 | A | * | 4/1999 | Jiang | ................... | H02M 1/4208 |
| | | | | | | 323/222 |
| 6,888,108 | B2 | | 5/2005 | Carr | | |
| 7,123,494 | B2 | | 10/2006 | Turchi | | |
| 8,169,205 | B2 | | 5/2012 | Chen et al. | | |
| 8,314,598 | B2 | | 11/2012 | Chen et al. | | |

(Continued)

FOREIGN PATENT DOCUMENTS

| CN | 201303290 Y | 9/2009 |
| CN | 103765743 A | 4/2014 |
| CN | 103973086 A | 8/2014 |

*Primary Examiner* — Yemane Mehari
(74) *Attorney, Agent, or Firm* — Michael C. Stephens, Jr.

(57) ABSTRACT

An EMI filter configured for an AC-DC switching power supply, and that is coupled between a DC-DC converter and a rectifier circuit that receives an AC power supply, can include: an input capacitor coupled in parallel to input terminals of the DC-DC converter; a transistor having a first terminal coupled to a first terminal of the input capacitor, and a second terminal coupled to ground; and a control circuit configured to generate a control signal that controls the transistor according to a feedback voltage that represents ripple information of an input voltage to the DC-DC converter, and at least one of a current that flows through the transistor, and a voltage at the first terminal of the transistor, where the control signal is used to regulate the voltage at the first terminal of the transistor to substantially eliminate switching frequency ripples from an input current of the DC-DC converter.

13 Claims, 5 Drawing Sheets

(56) References Cited

U.S. PATENT DOCUMENTS

| | | | |
|---|---|---|---|
| 8,461,774 B2* | 6/2013 | Nerone | H02M 1/44 |
| | | | 315/291 |
| 8,467,209 B2* | 6/2013 | Adragna | H02M 1/4225 |
| | | | 323/222 |
| 8,836,310 B2 | 9/2014 | Li et al. | |
| 9,419,511 B2 | 8/2016 | Huang et al. | |
| 2013/0093406 A1 | 4/2013 | Cheng | |
| 2013/0314961 A1* | 11/2013 | Eom | H02M 1/4208 |
| | | | 363/89 |
| 2016/0156259 A1 | 6/2016 | Zhang et al. | |
| 2017/0181234 A1* | 6/2017 | Huang | G05F 1/56 |
| 2017/0201173 A1* | 7/2017 | Dicke | H02M 3/156 |

* cited by examiner

EMI FILTER AND SWITCHING POWER SUPPLY WITH THE SAME

RELATED APPLICATIONS

This application claims the benefit of Chinese Patent Application No. 201510975860.1, filed on Dec. 22, 2015, which is incorporated herein by reference in its entirety.

FIELD OF THE INVENTION

The present invention generally relates to the field of power electronics, and more particularly to EMI filters and associated switching power supplies.

BACKGROUND

A switching power supply is a power supply that maintains an output voltage by controlling a ratio between an on time and an off time of a power switch/transistor. Switching power supplies are widely and preferably used in many electronic devices due to their relatively small size, light weight, and high conversion efficiency. In addition, switching power supplies are also finding applications in the rapidly developing electronic information industry.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Switching power supplies have been commonly used in various areas due to their relatively high conversion efficiency and diverse power conversion approaches. However, the electromagnetic environment is generally worsening, and normal operation of surrounding electronic equipment and power supplies may be affected due to electromagnetic interference (EMI) that may be caused by the switching power supply itself and power switching devices used inside. In addition, high frequency operation is an inevitable developing direction for switching power supplies as it may miniaturize the switching power supplies. However, high frequency operation may also increase such electromagnetic interference. Passive CLC filters may be utilized in some switching power supplies, in order to avoid harmonic pollution that may be generated when high frequency switching current flows into the power grid.

Figure 1:
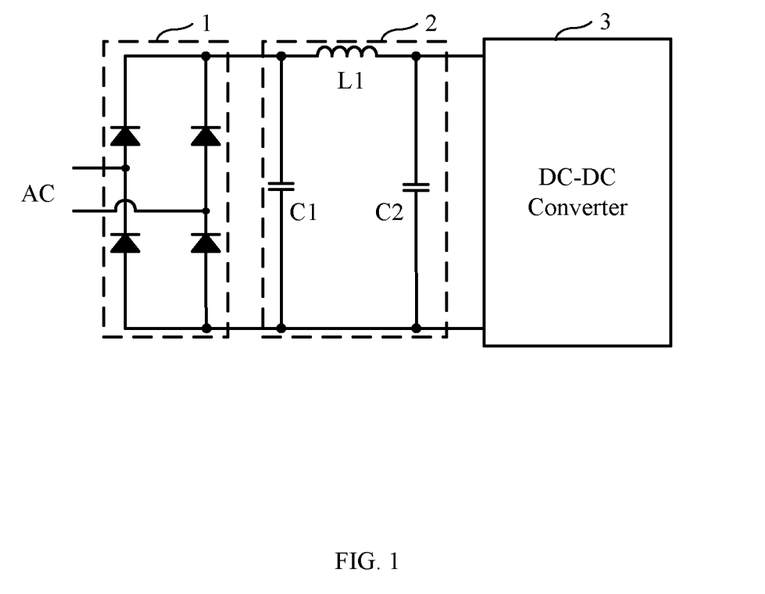
FIG. 1 is a schematic block diagram of an example switching power supply.

Referring now to FIG. 1, shown is a schematic block diagram of an example switching power supply. In this example, a switching power supply with a passive EMI filter is shown. The switching power supply can include rectifier circuit 1, passive EMI filter 2, and DC-DC converter 3. An AC mains "AC" can be rectified by rectifier circuit 1, and configured to supply a DC operating voltage to DC-DC converter 3 at a succeeding stage. Passive EMI filter 2 can connect between rectifier circuit 1 and DC-DC converter 3, and may be used to filter high switching ripples generated in DC-DC converter 3. This can prevent high frequency harmonic ripples from flowing into the power grid in a simple and effective way, and may substantially avoid harmonic pollution as a result. However, in such switching power supply, at least two passive components are needed in passive EMI filter 2, and a relatively large inductor of a high inductance value is generally required. As such, the miniaturization of such switching power supplies may be very difficult to achieve.

In one embodiment, an EMI filter configured for an AC-DC switching power supply, and that is coupled between a DC-DC converter and a rectifier circuit that receives an AC power supply, can include: (i) an input capacitor coupled in parallel to input terminals of the DC-DC converter; (ii) a transistor having a first terminal coupled to a first terminal of the input capacitor, and a second terminal coupled to ground; and (iii) a control circuit configured to generate a control signal that controls the transistor according to a feedback voltage that represents ripple information of an input voltage to the DC-DC converter, and at least one of a current that flows through the transistor, and a voltage at the first terminal of the transistor, where the control signal is used to regulate the voltage at the first terminal of the transistor in order to substantially eliminate switching frequency ripples from an input current of the DC-DC converter.

Figure 2:
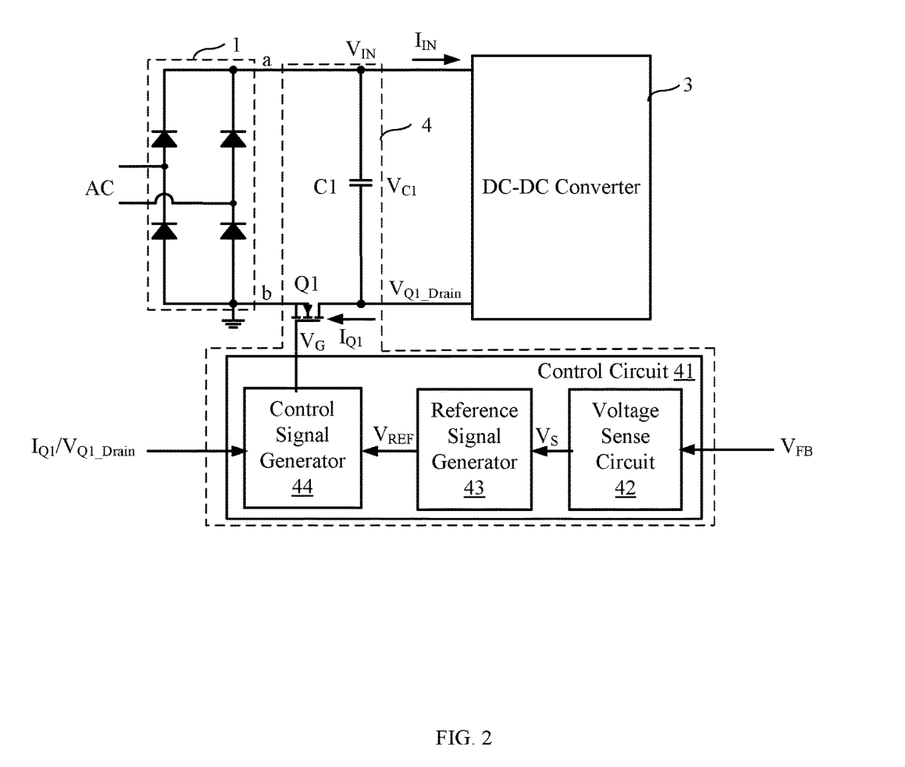
FIG. 2 is a schematic block diagram circuit diagram of an example switching power supply, in accordance with embodiments of the present invention.

Referring now to FIG. 2, shown is a schematic block diagram circuit diagram of an example switching power supply, in accordance with embodiments of the present invention. This particular example switching power supply can include rectifier circuit 1 that receives an AC mains "AC" with one output terminal "b" being grounded, and an output to provide a DC voltage. DC-DC converter 3 may have an input to receive the DC voltage as its input voltage $V_{IN}$, and EMI filter 4 can connect between rectifier circuit 1 and DC-DC converter 3.

For example, EMI filter 4 can include input capacitor C1, transistor Q1, and control circuit 41. Input capacitor C1 can connect in parallel to DC-DC converter 3 in order to filter input voltage $V_{IN}$. Transistor Q1 may have a first terminal coupled to a second terminal of input capacitor C1, and a second terminal that is grounded, and is also coupled to the second output terminal "b" of rectifier circuit 1. A first terminal of input capacitor C1 can connect to a first output terminal "a" of rectifier circuit 1. In some examples, transistor Q1 can be an N channel enhanced type field effect transistor. Transistor Q1 can be controlled to dynamically change voltage $V_{Q1\_Drain}$ of its first terminal (e.g., the drain of transistor Q1), in order to compensate for the ripples of the input capacitor in the switching power supply, so as to obtain a relatively smooth input current $I_{IN}$ without switching frequency ripples.

Control circuit 41 can generate control signal $V_G$ of transistor Q1 according to a feedback voltage $V_{FB}$ that represents ripple information of the input voltage, and current $I_{Q1}$ that flows through transistor Q1. Alternatively, control signal $V_G$ can be generated according to feedback voltage $V_{FB}$ that represents ripple information of the input voltage, and voltage $V_{Q1\_Drain}$ at the first terminal of transistor Q1. Control signal $V_G$ can be used to regulate voltage $V_{Q1\_Drain}$ at the first terminal of transistor Q1, such that input current $I_{IN}$ may not contain the switching frequency ripples. Feedback voltage $V_{FB}$ that represents ripple information of the input voltage can be a voltage sampling signal of voltage $V_{Q1\_Drain}$ at the first terminal of the transistor, or can be a ripple voltage of the voltage across input capacitor C1.

Control circuit 41 can include voltage sense circuit 42, reference signal generator 43, and control signal generator 44. For example, voltage sense circuit 42 can generate voltage sampling signal $V_S$ according to feedback voltage $V_{FB}$ that represents the ripple information of the input voltage. Reference signal generator 43 can generate reference signal $V_{REF}$ according to voltage sampling signal $V_S$. Control signal generator 44 can generate control signal $V_G$ according to reference signal $V_{REF}$ and current $I_{Q1}$ flowing through transistor Q1. Alternatively, control signal generator 44 can generate control signal $V_G$ according to reference signal $V_{REF}$ and voltage $V_{Q1\_Drain}$ at the first terminal of transistor Q1. Control signal $V_G$ can be used to regulate voltage $V_{Q1\_Drain}$ at the first terminal of transistor Q1, such that input current $I_{IN}$ may not contain the switching frequency ripples.

In particular embodiments, dynamic regulation of the voltage at the first terminal of the transistor can be performed by adopting an active EMI filter, in order to compensate the ripples on the input capacitor of the switching power supply, and to obtain a relatively smooth input current (e.g., to a DC-DC converter) without switching frequency ripples. In this way, high frequency harmonic ripples can be substantially prevented from flowing into the power grid, to substantially avoid harmonic pollution with a simplified implementation. In addition, circuit area can be reduced as compared to approaches that employ passive components, by instead using semiconductor devices to filter the switching frequency ripples. As a result, certain embodiments can be applied to applications that utilize full surface mounted devices. Further example implementation, as well as operating principles of circuit portions of control circuit 41 of the EMI filter, will be described in more detail below.

Figure 3:
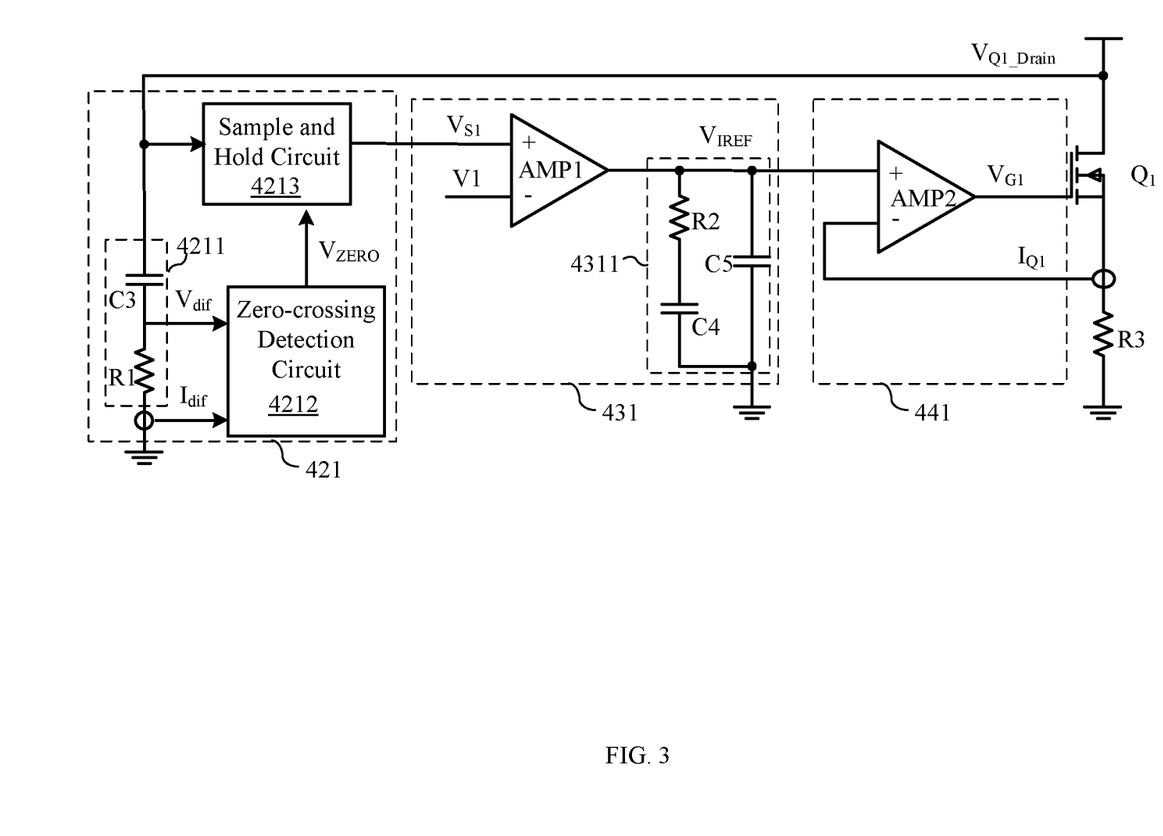
FIG. 3 is a schematic block diagram of an example control circuit in a switching power supply, in accordance with embodiments of the present invention.

Referring now to FIG. 3, shown is a schematic block diagram of an example control circuit in a switching power supply, in accordance with embodiments of the present invention. In this particular example, control circuit 41 in the EMI filter can include voltage sense circuit 421 that receives voltage $V_{Q1\_Drain}$ at the first terminal of transistor Q1, and generates voltage sampling signal $V_{S1}$. For example, voltage sense circuit 421 can include differentiating circuit 4211 coupled between the first terminal of transistor Q1 and ground. Differentiating circuit 4211 can receive voltage $V_{Q1\_Drain}$ from the first terminal of transistor Q1, and may perform a differential operation on voltage $V_{Q1\_Drain}$.

In this particular example, differentiating circuit 4211 can include capacitor C3 and resistor R1 connected in series, where resistor R1 has a terminal that is grounded. Differential voltage signal $V_{dif}$ may be provided at a common node of capacitor C3 and resistor R1, and a current that flows through resistor R1 can be obtained as a differential current signal $I_{dif}$ after a differential operation of voltage $V_{Q1\_Drain}$ is carried out by differentiating circuit 4211. It is to be understood that the differentiating circuit may also be implemented by other types of differentiating circuits as long as a suitable differential operation can be performed. Zero-crossing detecting circuit 4212 can generate zero-crossing detection signal $V_{ZERO}$ according to differential voltage signal $V_{dif}$ and/or differential current signal $I_{dif}$.

Figure 4:
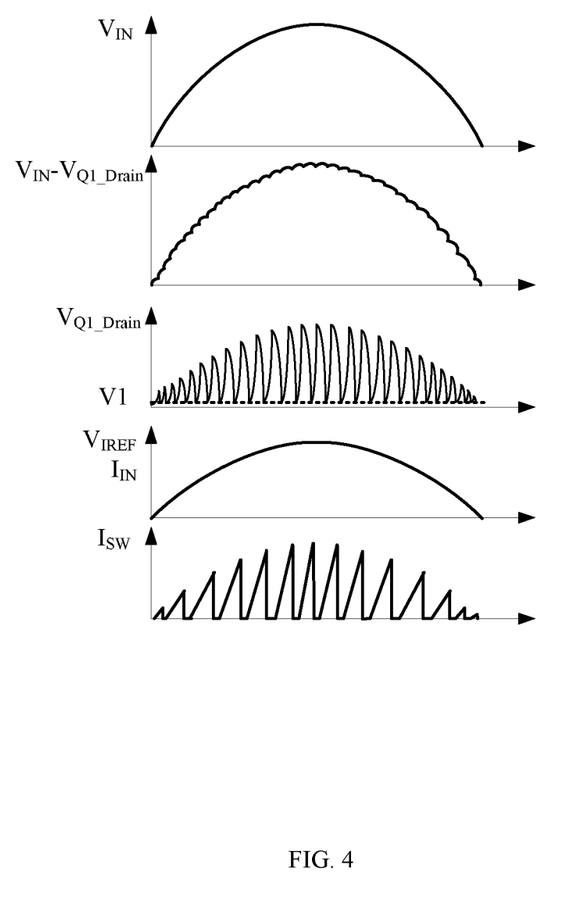
FIG. 4 is a waveform diagram of example operation of a switching power supply, in accordance with embodiments of the present invention.

Referring now to FIG. 4, shown is a waveform diagram of example operation of a switching power supply, in accordance with embodiments of the present invention. Generally, it is desirable to sample the peak voltage or valley voltage of voltage $V_{Q1\_Drain}$ at the first terminal of transistor Q1, which may have a relative large value, by performing a differential operation. Based on such circuit principles, the peak point or valley point of voltage $V_{Q1\_Drain}$ at the first terminal of transistor Q1 can be obtained when differential voltage signal $V_{dif}$ (or differential current signal $I_{dif}$) generated by differentiating circuit 4211 crosses zero.

For example, the peak point of voltage $V_{Q1\_Drain}$ at the first terminal of transistor Q1 can be obtained when differential voltage signal $V_{dif}$ (or differential current signal $I_{dif}$) crosses zero in a direction from positive to negative. Also, the valley point of voltage $V_{Q1\_Drain}$ at the first terminal of transistor Q1 can be obtained when differential voltage signal $V_{dif}$ (or the differential current) crosses zero in a direction from negative to positive. Thus, zero-crossing detection signal $V_{ZERO}$ can be generated when either differential voltage signal $V_{dif}$ or differential current signal $I_{dif}$ crosses zero. This facilitates sampling the peak value or the valley value of voltage $V_{Q1\_Drain}$ at the first terminal of transistor Q1.

In this particular example, the valley value of voltage $V_{Q1\_Drain}$ at the first terminal of transistor Q1 can be sampled in order to achieve optimal efficiency. Thus, zero-crossing detection signal $V_{ZERO}$ can be generated when either differential voltage signal $V_{dif}$ and/or differential current signal $I_{dif}$ crosses zero in the direction from negative to positive. Referring also to FIG. 3, sample and hold circuit 4213 can generate voltage sampling signal $V_{S1}$ according to voltage $V_{Q1\_Drain}$ at the first terminal of transistor Q1 and zero-crossing detection signal $V_{ZERO}$. Sample and hold circuit 4213 can obtain voltage $V_{Q1\_Drain}$ at the first terminal of transistor Q1 when zero-crossing detection signal $V_{ZERO}$ is active, such that the valley value of voltage $V_{Q1\_Drain}$ Drain may be used as voltage sense signal $V_{S1}$. In other examples, differentiating circuit 4211 and zero-crossing detecting circuit 4212 may not be necessary when voltage sense circuit 421 samples the average value of voltage $V_{Q1\_Drain}$.

Reference signal generator 431 can generate current reference signal $V_{IREF}$ according to voltage sampling signal $V_{S1}$. For example, reference signal generator 431 can include operational amplifier AMP1 having a non-inverting input terminal that receives voltage sampling signal $V_{S1}$, and an inverting input terminal that receives reference voltage V1. Compensation circuit 4311 can be coupled between an output terminal of operational amplifier AMP1 and ground, and a terminal of compensation circuit 4311 that is not connected to ground may provide current reference signal $V_{IREF}$. Compensation circuit 4311 can include resistor R2 and capacitor C4 connected in series between the output terminal of operational amplifier AMP1 and ground, and capacitor C5 connected between the output terminal of operational amplifier AMP1 and ground.

Operational amplifier AMP1 can inject or extract a current to/from compensation circuit 4311 according to a difference between reference voltage V1 and voltage sampling signal $V_{S1}$. Thus, current reference signal $V_{IREF}$ can be generated at the terminal of compensation circuit 4311 that is not connected to ground, according to reference voltage V1 and voltage sampling signal $V_{S1}$. Reference voltage V1 may represent the valley value of the voltage $V_{Q1\_Drain}$ at the first terminal of transistor Q1. It should be understood that compensation circuit 4311 may alternatively employ other structures, such as a compensation circuit only having a single capacitor.

In this way, the valley voltage of voltage $V_{Q1\_Drain}$ at the first terminal of transistor Q1 can be obtained in every switching cycle via voltage sampling circuit 421. In addition, the valley value of voltage $V_{Q1\_Drain}$ be substantially stable at reference voltage V1 with the regulation of reference signal generator 431. In the example waveform diagram of voltage $V_{Q1\_Drain}$ at the first terminal of transistor Q1, it can be seen that only the envelope of the voltage $V_{Q1\_Drain}$ may be controlled, and reference voltage V1 can be selected to be as small/low as possible in order to ensure a certain adjustment. Thus, voltage $V_{Q1\_Drain}$ at the first terminal of transistor Q1 may only contain a ripple voltage component of the switching frequency, but not too high of DC components. This can reduce losses of transistor Q1, and may substantially avoid bringing in further losses to the overall system.

Control signal generator 441 can generate control signal $V_{G1}$ of transistor Q1 according to current reference signal $V_{IREF}$ and current $I_{Q1}$ that flows through transistor Q1. Control signal generator 441 can include operational amplifier AMP2 having a non-inverting input terminal that receives current reference signal $V_{IREF}$, an inverting input terminal that receives current $I_{Q1}$ that flows through transistor Q1, and an output terminal that outputs control signal $V_{G1}$ of transistor Q1. Current $I_{Q1}$ that flows through transistor Q1 can be obtained by current sampling resistor R3. Control signal $V_{G1}$ of transistor Q1 can connect to the control terminal (e.g., gate) of transistor Q1, in order to control the conduction (e.g., on/off) thereof, and to further regulate current $I_{Q1}$.

For example, current reference signal $V_{IREF}$ that is generated by reference signal generator 431 can be a signal that has no switching ripple. Furthermore, by setting the parameters of components in compensation circuit 4311, current reference signal $V_{IREF}$ may be a signal that has the same phase as input voltage $V_{IN}$ and is approximately a sinusoidal wave, as shown in FIG. 4. By taking the current reference signal as the reference of current $I_{Q1}$ that flows through transistor Q1, input current $I_{IN}$ may substantially only track the power frequency component of switching current $I_{SW}$, rather than tracking a switching frequency component.

Thus, a current type EMI filter may be utilized to filter the switching ripples of current reference signal $V_{IREF}$ by sampling the valley voltage of voltage $V_{Q1\_Drain}$ at the first terminal of transistor Q1. Current reference signal $V_{IREF}$ may operate as the reference of current $I_{Q1}$ that flows through transistor Q1. Current $I_{Q1}$ flowing through transistor Q1 may be compared against current reference signal $V_{IREF}$, in order to generate control signal $V_{G1}$ for transistor Q1. Thus, current $I_{Q1}$ that flows through transistor Q1 may substantially only contain the power frequency component, and not ripples of the switching frequency. In this way, a high frequency harmonic wave can be substantially prevented from flowing into the power grid, thus avoiding harmonic pollution.

Figure 5:
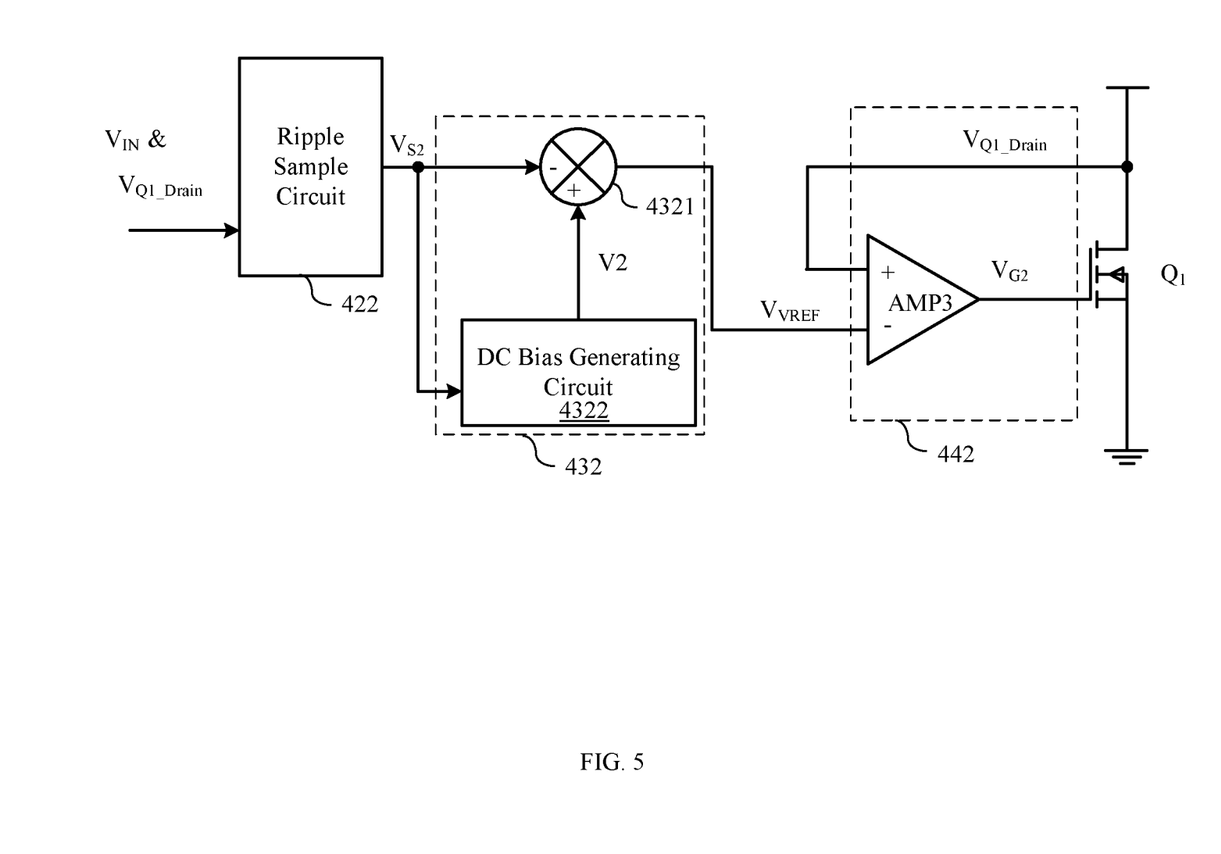
FIG. 5 is a schematic block diagram of another example control circuit in a switching power supply, in accordance with embodiments of the present invention.

Referring now to FIG. 5, shown is a schematic block diagram of another example control circuit in a switching power supply, in accordance with embodiments of the present invention. In this particular example, control circuit 41 in the EMI filter can include voltage sense circuit 422 that receives a voltage at the first terminal of input capacitor C1 and the voltage $V_{Q1\_Drain}$ at the first terminal of transistor Q1, and generates voltage sampling signal $V_{S2}$. Voltage sense circuit 422 can be a ripple voltage sense circuit that receives the voltage at the first terminal of input capacitor C1 and voltage $V_{Q1\_Drain}$ at the first terminal of transistor Q1, in order to obtain the voltage across input capacitor C1. In the switching power supply, the voltage across the input capacitor may be equal to a voltage difference between the voltage at the first terminal of input capacitor C1 and voltage $V_{Q1\_Drain}$ at the first terminal of transistor Q1. The ripple voltage sense circuit can take the ripples of the voltage across input capacitor C1 as voltage sampling signal $V_{S2}$.

Reference signal generator 432 can generate voltage reference signal $V_{VREF}$ according to voltage sampling signal $V_{S2}$. For example, reference signal generator 432 can include superimpose circuit 4321, which can generate voltage reference signal $V_{VREF}$ by subtracting voltage sampling signal $V_{S2}$ from DC bias voltage V2. Thus, voltage sampling signal $V_{VREF}$ can be obtained by initially generating an inverted signal of voltage sampling signal $V_{S2}$, and then by adding the DC bias voltage to the inverted signal. That is to say, voltage reference signal $V_{VREF}$ may have an opposite direction to the ripples of the voltage across input capacitor C1. Initially generating the inverted signal of voltage sampling signal $V_{S2}$, and the adding DC bias voltage V2 to the inverted signal can be performed in order to ensure voltage reference signal $V_{VREF}$ is greater than zero, in order as to avoid the generation of errors, and to facilitate the circuit design.

Moreover, in order to obtain a high efficiency, reference signal generator 432 may also include DC bias generating circuit 4322, which can generate the DC bias voltage V2 according to voltage sampling signal $V_{S2}$. DC bias generating circuit 4322 can regulate DC bias voltage V2 according to voltage sampling signal $V_{S2}$. For example, when voltage sampling signal $V_{S2}$ increases, DC bias voltage V2 can be regulated to increase. Further, when voltage sampling signal $V_{S2}$ decreases, DC bias voltage V2 can be regulated to decrease. In this way, voltage sampling signal $V_{VREF}$ may only contains ripple components, but not DC components, thus reducing system losses and improving operating efficiency.

Control signal generator 442 can generate control signal $V_{G2}$ for transistor Q1 according to voltage reference signal $V_{VREF}$ and voltage $V_{Q1\_Drain}$ at the first terminal of transistor Q1. Control signal generator 442 can include operational amplifier AMP3, which has an inverting input terminal that receives voltage reference signal $V_{VREF}$, a non-inverting input terminal that receives voltage $V_{Q1\_Drain}$ at the first terminal of the transistor, and an output terminal that provides control signal $V_{G2}$ for transistor Q1. Control signal $V_{G2}$ of transistor Q1 may be provided to the control terminal (e.g., gate) of transistor Q1, for changing the conduction state of transistor Q1, in order to regulate voltage $V_{Q1\_Drain}$.

Therefore, a voltage type EMI filter can initially filter the switching ripples by sampling the ripples of the voltage across input capacitor C1 as voltage sampling signal $V_{S2}$.

Reference voltage signal $V_{VREF}$ as a reference of voltage $V_{Q1\_Drain}$ at the first terminal of transistor Q1 can be generated by subtracting the ripples of the voltage across input capacitor C1 from the DC bias voltage. Reference voltage signal $V_{VREF}$ can be compared against voltage $V_{Q1\_Drain}$ at the first terminal of transistor Q1, and control signal $V_{G2}$ for transistor Q1 can be generated. Thus, voltage $V_{Q1\_Drain}$ at the first terminal of transistor Q1 may counteract the ripples of the voltage across the input capacitor as they have opposite directions. Also, input voltage $V_{IN}$ may not contain ripples of the switching frequency, and input current $I_{IN}$ may be a power frequency signal having no switching frequency ripple. In this way, high frequency harmonic waves can be substantially prevented from flowing into the power grid, the substantially avoiding associated harmonic pollution.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An electromagnetic interference (EMI) filter configured for an AC-DC switching power supply, said EMI filter being coupled between a DC-DC converter and a rectifier circuit that receives an AC power supply, the EMI filter comprising:
   a) an input capacitor coupled in parallel to two input terminals of said DC-DC converter;
   b) a transistor having two power terminals coupled in series with said input capacitor between two output terminals of said rectifier circuit; and
   c) a control circuit configured to generate a control signal that controls a control terminals of said transistor to control a current that flows through said transistor in order to substantially eliminate a switching frequency ripple component;
   d) wherein said control circuit comprises a first voltage sense circuit configured to generate a first voltage sampling signal from a drain voltage of said transistor, a first reference signal generator configured to generate a current reference signal according to said first voltage sampling signal, and a first control signal generator configured to generate said control signal according to said current reference signal and said current that flows through said transistor.

2. The EMI filter of claim 1, wherein said control circuit further comprises:
   a) a second voltage sense circuit configured to receive said voltage at a first terminal of said transistor, and to generate a second voltage sampling signal;
   b) a second reference signal generator configured to generate a voltage reference signal according to said second voltage sampling signal; and
   c) a second control signal generator configured to generate said control signal according to said voltage reference signal and said voltage at said first terminal of said transistor.

3. The EMI filter of claim 1, wherein said first voltage sense circuit comprises:
   a) a differentiating circuit coupled between a first terminal of said transistor and said ground, and being configured to receive said voltage at said first terminal of said transistor, and to generate a differential voltage signal and a differential current signal via differential operation;
   b) a zero-crossing detecting circuit configured to generate a zero-crossing detection signal according to at least one of said differential voltage signal and said differential current signal; and
   c) a sample and hold circuit configured to generate a first voltage sampling signal according to said voltage at said first terminal of said transistor and said zero-crossing detection signal.

4. The EMI filter of claim 1, wherein said first reference signal generator comprises:
   a) an operational amplifier having a non-inverting input terminal configured to receive said first voltage sampling signal, and an inverting input terminal configured to receive a reference voltage; and
   b) a compensation circuit coupled between an output terminal of said operational amplifier and ground, and being configured to output said current reference signal.

5. A switching power supply, comprising said EMI filter of claim 1.

6. The EMI filter of claim 2, wherein said second voltage sense circuit comprises a ripple voltage sense circuit configured to receive said voltage at a second terminal of said input capacitor and said voltage at said first terminal of said transistor, and to generate a voltage across said input capacitor, wherein said ripple voltage sense circuit is configured to sample ripples of said voltage across said input capacitor, and to generate said second voltage sampling signal.

7. The EMI filter of claim 2, wherein said second reference signal generator comprises a superimpose circuit configured to subtract said second voltage sampling signal from a DC bias voltage, and to generate said voltage reference signal.

8. The EMI filter of claim 7, wherein said second reference signal generator further comprises a DC bias generator configured to generate said DC bias voltage according to said second voltage sampling signal.

9. An electromagnetic interference (EMI) filter configured for an AC-DC switching power supply, said EMI filter being coupled between a DC-DC converter and a rectifier circuit that receives an AC power supply, the EMI filter comprising:
   a) an input capacitor coupled in parallel to two input terminals of said DC-DC converter;
   b) a transistor having two power terminals coupled in series with said input capacitor between two output terminals of said rectifier circuit; and
   c) a control circuit configured to generate a control signal to control a control terminal of said transistor to control a drain voltage of said transistor to compensate a ripple component of a voltage signal across said input capacitor;
   d) wherein said control circuit comprises a voltage sense circuit configured to generate a voltage sampling signal from said voltage across said input capacitor, a reference signal generator configured to generate a voltage reference signal according to said voltage sampling signal, and a control signal generator configured to generate said control signal according to said voltage reference signal and said drain voltage of said transistor.

10. The EMI filter of claim 9, wherein said voltage sense circuit comprises a ripple voltage sense circuit configured to receive said voltage at a second terminal of said input capacitor and said voltage at a first terminal of said transistor, and to generate a voltage across said input capacitor, wherein said ripple voltage sense circuit is configured to sample ripples of said voltage across said input capacitor, and to generate said voltage sampling signal.

11. The EMI filter of claim 9, wherein said reference signal generator comprises a superimpose circuit configured to subtract said voltage sampling signal from a DC bias voltage, and to generate said voltage reference signal.

12. A switching power supply, comprising said EMI filter of claim 9.

13. The EMI filter of claim 11, wherein said reference signal generator further comprises a DC bias generator configured to generate said DC bias voltage according to said voltage sampling signal.

* * * * *